United States Patent [19]
Kim et al.

[11] Patent Number: 6,004,862
[45] Date of Patent: Dec. 21, 1999

[54] CORE ARRAY AND PERIPHERY ISOLATION TECHNIQUE

[75] Inventors: Unsoon Kim, Santa Clara; Hung-Sheng Chen, San Jose; Kashmir Sahota, Fremont; Yu Sun, Saratoga, all of Calif.

[73] Assignee: Advanced Micro Devices, Inc., Sunnyvale, Calif.

[21] Appl. No.: 09/008,320

[22] Filed: Jan. 20, 1998

[51] Int. Cl.⁶ .................................................. H01L 21/76
[52] U.S. Cl. ......................... 438/425; 438/424; 438/296; 438/444
[58] Field of Search ................................... 438/424, 425, 438/426, 444, 296; 148/DIG. 50

[56] References Cited

U.S. PATENT DOCUMENTS

| | | | |
|---|---|---|---|
| 4,944,836 | 7/1990 | Beyer et al. | 156/645 |
| 5,084,071 | 1/1992 | Nenadic et al. | 51/309 |
| 5,712,205 | 1/1998 | Park et al. | 438/425 |
| 5,728,620 | 3/1998 | Park | 438/426 |
| 5,858,830 | 1/1999 | Yoo et al. | 438/425 |

*Primary Examiner*—Trung Dang
*Attorney, Agent, or Firm*—Foley & Lardner

[57] ABSTRACT

A process for forming a semiconductor integrated circuit with a core area densely populated with active devices and with a periphery area less densely populated with active devices as compared to the core area, comprising the steps of: forming a first layer of first insulator material above a semiconductor substrate having a core area and a periphery area, wherein the first insulator material constitutes a polish stop for polishing processes and also as an oxidation barrier; patterning the first layer of first insulator material to expose first portions of the semiconductor substrate substantially only in the core area while using the first insulator material to substantially mask the periphery area; forming a plurality of trenches into the exposed first portions of semiconductor substrate in the core area; filling the plurality of trenches with an insulator; polishing down to the first layer of first insulator material; removing the first layer of first insulator material; forming a second layer of first insulator material over the core and periphery areas; forming openings down into the second layer of first insulator material to expose second portions of the semiconductor substrate substantially only in the periphery area while using the second layer to substantially mask the core area; and forming an isolation region in the exposed second portions of the semiconductor substrate.

8 Claims, 3 Drawing Sheets

6,004,862

CORE ARRAY AND PERIPHERY ISOLATION TECHNIQUE

BACKGROUND OF THE INVENTION

The present invention relates generally to methods for forming integrated circuit chips, and more particularly, to a method for simplifying the processing of core and periphery isolation regions.

An integrated circuit chip comprises an array of devices formed in a semiconductor substrate, with the contacts for these devices interconnected by patterns of conductive wires. As the density of devices fabricated on a given chip increases, problems arise in providing reliable isolation between devices. Additionally, the core area on a chip may utilize different device dimensions than the periphery area on the chip. These different device dimensions necessarily require different isolation techniques which further complicate the processing of the overall chip.

SUMMARY OF THE INVENTION

Briefly, the present invention comprises a process for forming a semiconductor integrated circuit with a core area densely populated with active devices and with a periphery area less densely populated with active devices as compared to the core area, comprising the steps of forming a first layer of a first insulator material capable of forming a polish stop for a polishing step and also acting as an oxidation barrier, with the first layer being formed above a semiconductor substrate having a core area and a periphery area; patterning the first layer of the first material to expose first portions of the semiconductor substrate substantially only in the core area while using the first layer to substantially mask the periphery area; forming a plurality of trenches into the exposed first portions of the semiconductor substrate in the core area; filling the plurality of trenches with an insulator; polishing down to the first layer of first material; removing the first layer; forming a second layer of the first material over the core and periphery areas; forming openings down into the second layer of the first material to expose second portions of the semiconductor substrate substantially only in the periphery area while using the second layer of first material to mask the core area; and forming an isolation region in the exposed second portions of the semiconductor substrate.

In a further aspect of the present invention, the first layer forming step may comprise the step of forming the first layer of first insulator material above a semiconductor substrate that has a tunnel oxide layer directly over the semiconductor substrate, a layer of doped polysilicon over the tunnel oxide, and a high temperature oxide layer over the polysilicon layer. The trench forming step may comprise the step of anisotropically etching the exposed first portions of the semiconductor substrate.

In yet a further aspect of the present invention, the first layer forming step may comprise the step of forming the first layer of first insulator material over an oxide layer which is formed directly over the semiconductor substrate.

In a yet further aspect of the present invention, the isolation region forming step may comprise the step of forming a field oxide in the exposed second portions of the semiconductor substrate.

In a further aspect of the invention, a process is provided for forming a semiconductor integrated circuit with a core area densely populated with active devices and with a periphery area less densely populated with active devices as compared to the core areas, comprising the steps of: forming a first layer of silicon nitride above a semiconductor substrate having a core area and a periphery area; patterning the first layer of silicon nitride to expose portions of the semiconductor substrate substantially only in the core area while using the silicon nitride to substantially mask the periphery area; forming a plurality of trenches into the exposed first portions of the semiconductor substrate in the core area; and filling the plurality of trenches with an insulator. This process further includes the steps of polishing down to the first layer of silicon nitride; removing the first silicon nitride layer; forming a second layer of silicon nitride over the core and periphery areas; forming openings down into the second layer of silicon nitride to expose second portions of the semiconductor substrate substantially only in the periphery area while substantially masking the core area; and forming an isolation region in the exposed second portions of the semiconductor substrate.

DETAILED DESCRIPTION OF THE PREFERRED EMBODIMENT

Figure 1:
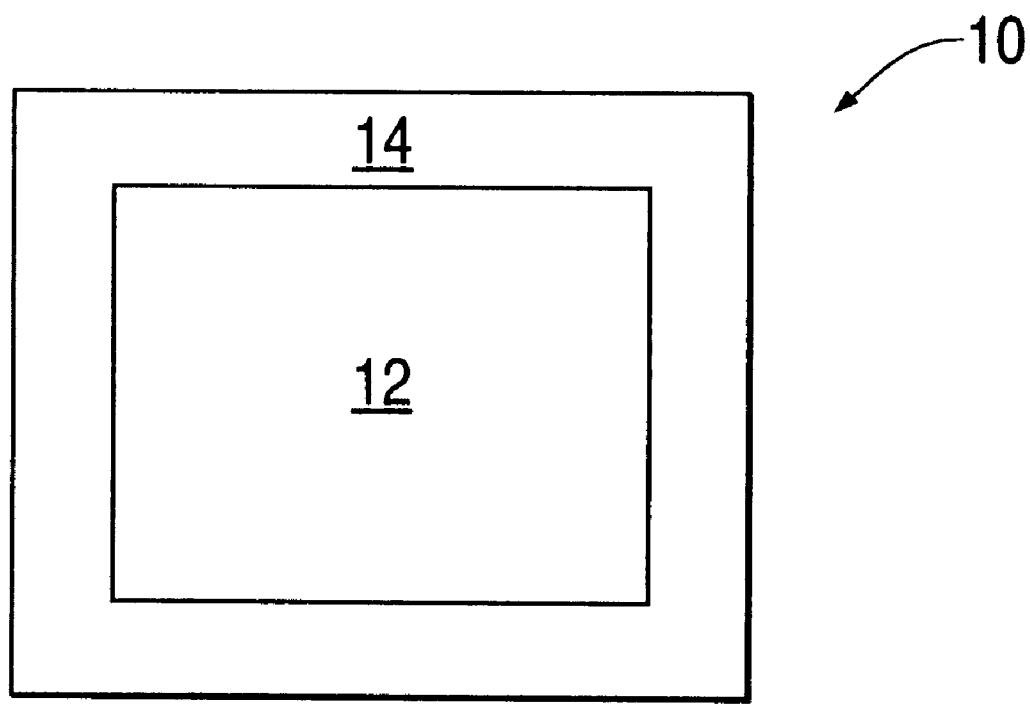
FIG. 1 is a schematic diagram of the top view of a chip showing a core area and a periphery area.

Referring now to the drawings, these drawings are provided to illustrate one exemplary implementation of the present invention, and are not intended to be limiting in their scope. Additionally, it should be noted that these drawings are illustrative in nature and thus, are not drawn to scale. It should also be noted that although various thickness dimensions are provided in the example embodiments, these dimensions are not intended to be limiting, and it is contemplated that these dimensions will change as processes change. Moreover, various well-known process and clean steps have not been recited in the present description in order to properly focus the disclosure of the invention.

Referring now to FIG. 1, there is shown the top view of a chip 10 comprising a core area 12 that is to be densely populated with active devices, and a periphery area 14 that is to be less densely populated with active devices, as compared to the core area 12. This type of configuration is particularly advantageous for memory chips such as flash memory chips.

Figure 2A:
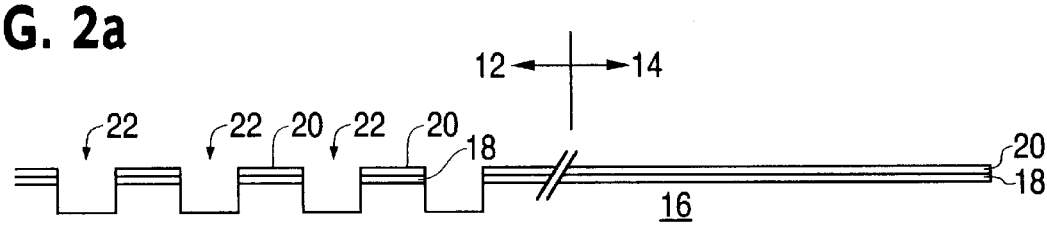
FIG. 2a is a side view cross-section of a semiconductor substrate after the performance of various core processing steps to form trenches in the core.

Referring now to FIG. 2a, there is shown the side view of a semiconductor substrate 16 which, in an exemplary embodiment, may comprise a silicon substrate. By way of example, this silicon substrate 16 may comprise single crystal P-type silicon.

FIG. 2a illustrates the substrate 16 after the formation of a thin layer of insulator such as a barrier oxide 18 formed over the silicon substrate 16. This insulator layer 18 may conveniently comprise a thermally grown oxide which typically is grown to a thickness of, for example, on the order of 100–200 Å. Formed over this insulator layer 18 is a second different insulator layer 20 which is chosen specifically to act as a polish stop and also to act as oxidation barrier in order to perform masking functions. By way of example, this second different insulator layer 20 may comprise a silicon nitride ($Si_xN_y$) layer formed by means of a CVD process. Although not intended to be limiting, an example thickness for this layer of second insulator material 20 is 1000–2000 Å.

One of the features of the present processing invention is to utilize the insulator layer 20 of silicon nitride to protect the periphery area 14 of the chip 10, while various processing trench-forming steps are carried out in the core area 12. To accomplish this goal, the initial structure is patterned with a photo-resist layer (not shown). Using standard photolithography and etching techniques which are well-known in the art, openings are formed in the photoresist down to the surface of the silicon substrate 16 in the regions 22 substantially only in the core area 12 (leaving the periphery protected). Appropriate etch solutions are utilized to remove the silicon nitride layer 20 and the oxide layer 18 in the regions 22. The next step is to form trenches down into the silicon substrate 16 in the exposed regions 22 in a well-known manner. By way of example, the trenches may be formed in the regions 22 by directionally etching the exposed top surface of the silicon substrate 16 using an anisotropic plasma etch. The result of this directional etching process is trenches having sidewalls which are substantially vertical, as can be seen from FIG. 2a. Then the photoresist is stripped from the surface.

Figure 2B:
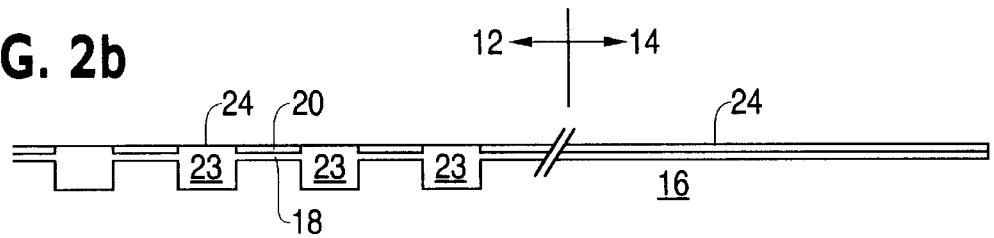
FIG. 2b is a side view cross-section of the semiconductor substrate of FIG. 2a after the performance of trench fill and planarization steps.

Referring to FIG. 2b, the trenches in regions 22 are filled with an insulator material 23 such as a TEOS to a thickness on the order of 6000 Å, by way of example.

The uneven surface remaining after this TEOS formation step is then planarized. By way of example, but not by way of limitation, a chemical-mechanical polishing (CMP) process may be utilized to obtain this planarization. Chemical-mechanical polishing processes employ both a chemical and a mechanical component. A rotating or vibrating disk or pad is moved relative to the semiconductor wafer surface in the presence of a chemical-mechanical polishing slurry. This CMP slurry includes suspended solids as well as a chemical solution component which attacks the material being polished. The two processes in combination etch the upper layer of a wafer by chemical and mechanical action which removes high points much faster than the low points on the wafer surface. Typical chemical-mechanical polishing methods and slurry are disclosed in U.S. Pat. Nos. 4,944,836 and 5,084,071. A chemical-mechanical polishing slurry typically utilizes silica or alumina particles as the mechanical grit in the slurry. The chemicals utilized in order to etch the material are standard chemicals used in the art. Note that in some embodiments of this process, mechanical grit may be utilized in the slurry without a chemical etchant. The result of this chemical-mechanical polishing process is a substantially planar upper surface 24. Note that it is possible that the TEOS fill 23 may be recessed somewhat after CMP and/or after densification that occurs during high temperature anneal steps.

It should be noted that in order to facilitate this chemical-mechanical polishing process, it is particularly important to utilize an oxidation barrier insulator material in layer 20 which also acts with good selectivity as a polish stop for the chemical-mechanical polishing step. Silicon nitride and other materials with these characteristics are particularly useful in this regard. When the chemicalmechanical polishing apparatus polishes down to the top of the silicon nitride layer 20, the apparatus will detect this top surface of the silicon nitride because of a change in the etch rate of that surface and/or the hardness of that surface. Accordingly, a plurality of isolation regions 23 are formed in the core area 12, while utilizing the layer 20 to protect the periphery areas 14.

Figure 2C:
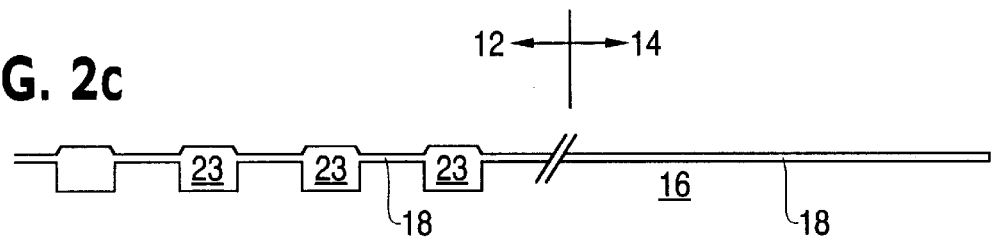
FIG. 2c is a side view cross-section of the semiconductor substrate of FIG. 2b after the performance of a nitride strip step.

The next set of processing steps perform operations in the periphery area 14 while the core area 12 is masked. In this regard, referring to FIG. 2c the silicon nitride layer 20 is stripped utilizing a standard chemical stripping bath to yield the topography shown. Note that the topography may differ to some extent if the TEOS fill regions 23 have become recessed due to CMP processing and/or densification.

Figure 2D:
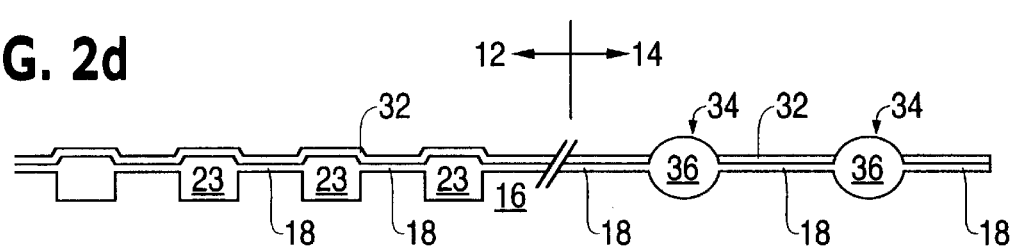
FIG. 2d is a side view cross-section of the semiconductor substrate of FIG. 2c after the performance of an overall nitride deposition and the formation of isolation regions in the periphery.

Referring to FIG. 2d, a fresh layer 32 of the first insulator material (silicon nitride in the present example) is then deposited on the oxide layer 18 to a thickness on the order of 1000 Å–2000 Å to form an oxidation barrier. The silicon nitride layer 32 may be deposited by means of a CVD process. A photo-resist layer (not shown) may be formed over the surface of the silicon nitride and patterned substantially only in the periphery area 14 to facilitate the formation of openings in the regions 34 down to the top surface of the silicon nitride layer 32. This patterning may again be accomplished by means of standard photo-lithography and etching techniques. Standard etching techniques may then be utilized to remove the silicon nitride layer 32 and the oxide layer 18 in the openings in the patterned photo-resist to expose the surface of the silicon substrate 16 in the regions 34. The photoresist layer is then removed. An isolation region 36 is then formed in each of the regions 34, having different dimensions from the isolation regions 23 formed in the core area 12. By way of example, the isolation regions in the regions 34 could be trench oxide isolation. In FIG. 2d, the isolation formed in the regions 34 comprise field oxide regions 36 grown, by way of example, by conventional oxidation techniques in the exposed areas of the region 34.

From the above description, it can be seen that isolation regions 23 can be formed in the core area 12 with one set of dimensions and processes, and separate different isolation regions 36 can be formed in the periphery area 14 using different processes. The layer 20 of first material (the silicon nitride) functions to mask the periphery regions 14 during the processing of the core and also functions as a polish stop. The second layer 32 of the first insulator material (the silicon nitride) functions to mask and protect the core region while isolation regions 36 with different dimensions are formed in the periphery area 14.

Figure 2E:
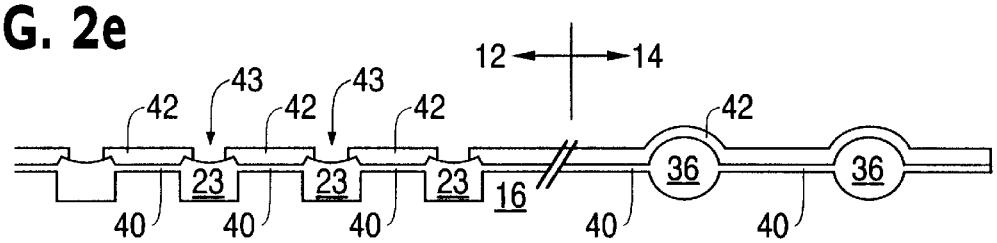
FIG. 2e is a side view cross-section of the semiconductor substrate of FIG. 2d after the performance of a second nitride strip step and various polysilicon steps.

Referring to FIG. 2e, the second silicon nitride layer 32 is stripped utilizing a standard chemical etching bath, by way of example. Then the oxide layer 18 is stripped, again using a standard chemical bath. A tunnel oxide layer 40 is formed by standard techniques. A layer 42 of polysilicon is then formed. A patterned layer of photoresist (not shown) is formed over the layer 42 of polysilicon using standard photolithography techniques, with openings exposing the polysilicon in the regions 43 substantially only in the core area 12. Then a directional reactive ion etch is utilized to etch the exposed polysilicon in the regions 43 down to the top surface of the isolation regions 23. The photoresist is then stripped to yield the configuration shown in FIG. 2e.

The resulting structure may then be used to form a variety of different devices including flash memories.

Figure 3A:
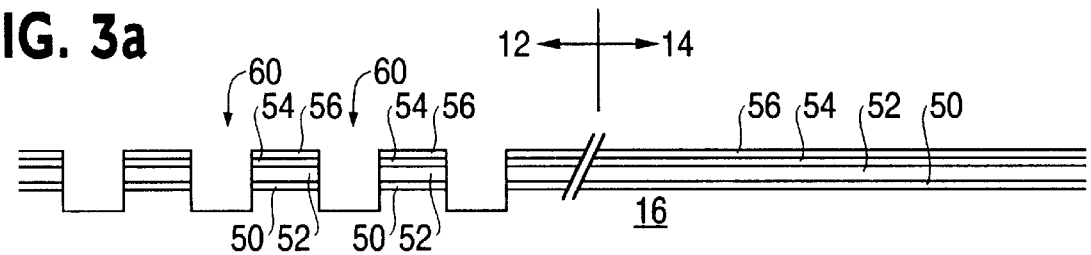
FIG. 3a is a side view cross-section of a semiconductor substrate after a series of process steps for a self aligned trench core including a first polysilicon layer forming step and a silicon nitride layer forming step.

It should be noted that the present inventive process may also be conveniently utilized to form self-aligned structures such as self-aligned gate structures. Referring to FIG. 3a, a semiconductor substrate 16 is shown that includes a tunnel oxide layer 50 disposed on the silicon surface, followed by a layer 52 of polysilicon that is doped either during or after deposition, followed by an oxide layer 54 such as an HTO layer, and finally a layer of silicon nitride ($Si_xN_y$). By way of example, but not by way of limitation, in an exemplary embodiment, the tunnel oxide layer 50 may be formed to a thickness on the order of 80–120 Å, the polysilicon layer 52 may be formed to a thickness on the order of 500–1500 Å and may be heavily doped, and the high temperature oxide HTO layer 54 may be formed to a thickness on the order of 100–300 Å. The HTO layer 54 is utilized to prevent the attack of phosphate acid and other acids into the polysilicon layer. The silicon nitride layer 56 may have a thickness on the order of 1000 Å to 2000 Å.

The device is then patterned with photoresist using standard photolithography techniques and multiple dry plasma etch steps are utilized to form trenches 60 into the silicon substrate 16 with substantially vertical sidewalls in open areas of the patterned photoresist. The trenches 60 are formed substantially only in the core area 12, with the silicon nitride layer 56 masking the periphery area 14 during the trench-forming processing steps.

Figure 3B:
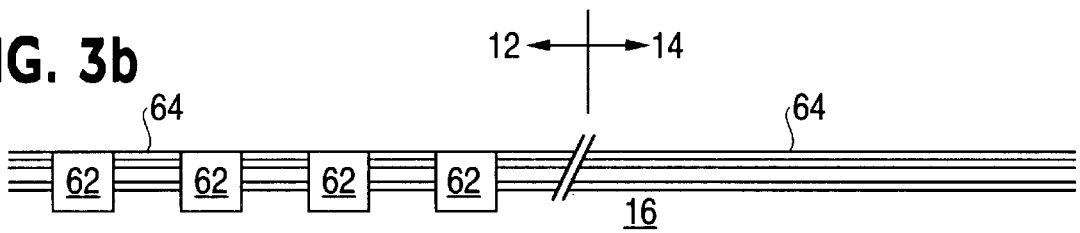
FIG. 3b is a side view cross-section of FIG. 3a after processing steps including an oxide fill step and a CMP step.

Referring to FIG. 3b, the device of FIG. 3a is shown after the trenches 60 are filled with an insulator 62, such as TEOS, as described previously. Then, the uneven surfaces remaining after this TEOS layer formation step are planarized. By way of example, the planarization step may be performed by means of chemical-mechanical polishing to realize a substantially planar surface 64. As noted previously, there is the potential that the TEOS region 62 may be recessed to some extent by the CMP step and/or by densification caused by subsequent anneal steps.

Figure 3C:
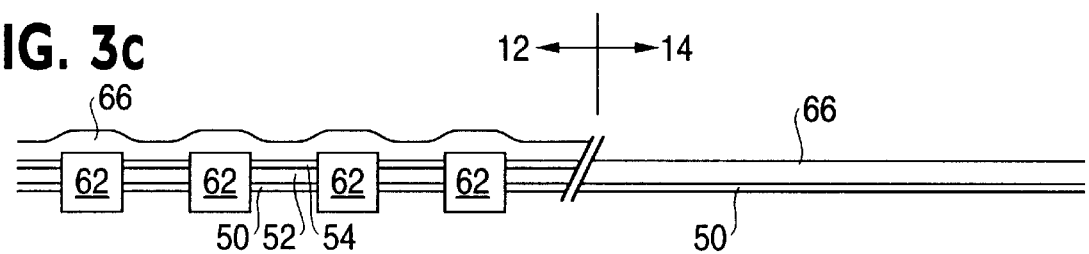
FIG. 3c is a side view cross-section of FIG. 3b after processing steps including a second silicon nitride deposition.

Referring to FIG. 3c, the silicon nitride layer 64 is stripped using standard etching techniques. Then the core area 12 is masked and the HTO layer 54 and the polysilicon layer 52 are stripped in the periphery area using standard etching techniques. The mask over the core is removed and a second silicon nitride deposition step is performed to obtain a silicon nitride layer 66 over both the core area 12 and the periphery area 14 of about 1000 Å–2000 Å in thickness.

Figure 3D:
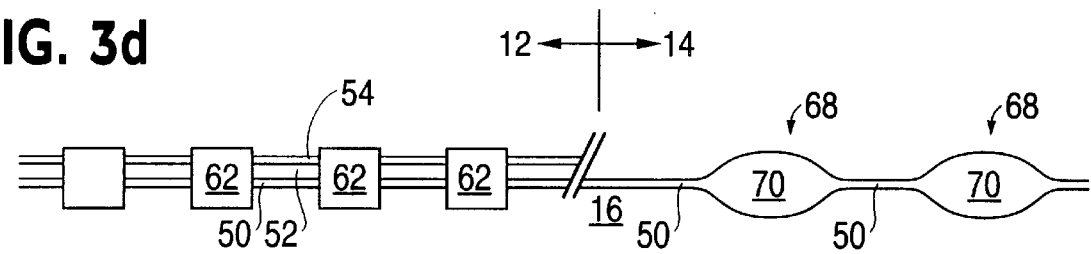
FIG. 3d is a side view cross-section of FIG. 3c after processing steps including a nitride strip step and locos formation step.

Referring to FIG. 3d, isolation regions 70 are formed in the periphery area 14 by forming a patterned photoresist layer using standard photolithography techniques with openings in the pattern at selected regions 68 in the periphery area 14. These openings are etched down to the silicon substrate 16. Then isolation regions, such as trench isolation or a standard field oxide (LOCOS), may be formed in the exposed silicon substrate. In FIG. 3d, field oxide isolation regions 70 are formed using a thermal growth process. Then the photoresist layer and the silicon nitride layer 66 are removed to yield the structure of FIG. 3d.

The resulting structure may then be utilized to form a variety of different devices, including flash memories.

It should be noted that in interpreting the word "above", in the specification and claims, the word is not intended to be restricted to directly above, but may include intervening layers between a layer described as being "above" another layer or substrate. Accordingly, the description of a first layer of a first material above a semiconductor substrate is not intended to exclude other layers being disposed therebetween.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment herein was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A process for forming a semiconductor integrated circuit with a core area densely populated with active devices and with a periphery area less densely populated with active devices as compared to said core area, comprising the steps of:

forming a first layer of first insulator material above a semiconductor substrate having a core area and a periphery area, wherein said first insulator material constitutes a polish stop for polishing processes and also an oxidation barrier;

patterning said first layer of first insulator material to expose first portions of said semiconductor substrate substantially only in said core area while using said first insulator material to substantially mask said periphery area;

forming a plurality of trenches into said exposed first portions of semiconductor substrate in said core area;

filling said plurality of trenches with an insulator;

polishing down to said first layer of first insulator material;

removing said first layer of first insulator material;

forming a second layer of first insulator material over said core and periphery areas;

forming openings down into said second layer of first insulator material to expose second portions of said semiconductor substrate substantially only in said periphery area while using said second layer to substantially mask said core area; and forming an isolation region in said exposed second portions of said semiconductor substrate.

2. A process as defined in claim 1, wherein said first layer forming step comprises the step of forming said first layer of first insulator material above a semiconductor substrate that has a tunnel oxide layer directly over said semiconductor substrate, a layer of doped polysilicon over said tunnel oxide, and a high temperature oxide layer over said polysilicon layer.

3. A process as defined in claim 1, wherein said trench forming step comprises the step of anisotropically etching said exposed first portions of said semiconductor substrate.

4. A process as defined in claim 1, wherein said polishing step comprises the step of chemical-mechanical polishing said semiconductor.

5. A process as defined in claim 1, wherein said first layer forming step comprises the step of forming said first layer of first insulator material over an oxide layer which is formed directly over said semiconductor substrate.

6. A process as defined in claim 1, wherein said isolation region forming step comprises the step of forming a field oxide in said exposed second portions of said semiconductor substrate.

7. A process as defined in claim 1, wherein said first insulator material is silicon nitride.

8. A process for forming a semiconductor integrated circuit with a core area densely populated with active devices and with a periphery area less densely populated with active devices as compared to said core area, comprising the steps of:

forming a first layer of silicon nitride above a semiconductor substrate having a core area and a periphery area;

patterning said first layer of silicon nitride to expose first portions of said semiconductor substrate substantially only in said core area while using said silicon nitride to substantially mask said periphery area;

forming a plurality of trenches into said exposed first portions of said semiconductor substrate in said core area;

filling said plurality of trenches with an insulator;

polishing down to said first layer of silicon nitride;

removing said first silicon nitride layer;

forming a second layer of silicon nitride over said core and periphery areas;

forming openings down into said second layer of silicon nitride to expose second portions of said semiconductor substrate substantially only in said periphery area while using said second silicon nitride layer to substantially mask said core area; and forming an isolation region in said exposed second portions of said semiconductor substrate.

* * * * *